(12) United States Patent
Choi

(10) Patent No.: US 8,105,757 B2
(45) Date of Patent: Jan. 31, 2012

(54) METHOD OF MAKING A SEMICONDUCTOR DEVICE

(75) Inventor: Jae Seung Choi, Icheon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 795 days.

(21) Appl. No.: 11/175,468

(22) Filed: Jul. 6, 2005

(65) Prior Publication Data

US 2006/0138462 A1      Jun. 29, 2006

(30) Foreign Application Priority Data

Dec. 23, 2004   (KR) .......................... 10-2004-0111386

(51) Int. Cl.
*G03F 1/00*     (2006.01)
(52) U.S. Cl. .................. 430/311; 430/5; 430/4; 430/30
(58) Field of Classification Search ........................ None
See application file for complete search history.

(56) References Cited

U.S. PATENT DOCUMENTS

| | | | |
|---|---|---|---|
| 6,103,626 A | 8/2000 | Kim | 438/691 |
| 6,563,148 B2 | 5/2003 | Kawashima et al. | 257/202 |
| 6,693,315 B2 * | 2/2004 | Kuroda et al. | 257/288 |
| 2002/0151157 A1 | 10/2002 | Kim et al. | |
| 2004/0063038 A1 * | 4/2004 | Shin et al. | 430/311 |
| 2005/0064304 A1 * | 3/2005 | Kim et al. | 430/5 |

FOREIGN PATENT DOCUMENTS

| | | |
|---|---|---|
| JP | 10-092706 | 4/1998 |
| JP | 2000-77681 A | 9/2001 |
| JP | 2003241362 | 8/2003 |
| JP | 2003-17390 A | 8/2004 |
| KR | 10-1998-0040591 | 8/1998 |
| KR | 10-2003-0056499 | 7/2003 |
| KR | 20040070801 | 8/2004 |

* cited by examiner

*Primary Examiner* — Daborah Chacko Davis
(74) *Attorney, Agent, or Firm* — Marshall, Gerstein & Borun LLP

(57) ABSTRACT

Disclosed is a method of making a semiconductor device in which a main pattern is formed through a photolithography process over a low-density pattern area having a relatively small number of patterns to be formed in certain areas as compared to the other areas. According to the method at least one or more dummy patterns are formed over inactive areas, adjacent to active areas, where the main pattern is formed, and are spaced a predetermined distance from the sides of the main pattern. This method can improve the process margin and improve the uniformity of critical regions of patterns to thus improve the yield of a semiconductor device by making a low-density pattern area with the same pattern density as high-density or intermediate-density pattern areas by forming dummy patterns, which do not affect the semiconductor device, on the sides of a main pattern of the low-density pattern area according to a design rule.

6 Claims, 4 Drawing Sheets

| Defocus | Isolated | Prior invention | Present invention |
|---|---|---|---|
| -0.4 | | | 125 |
| -0.3 | | | 132 |
| -0.2 | 120 | 136 | 148 |
| -0.1 | 143 | 148 | 147 |
| 0 | 150 | 152 | 153 |
| 0.1 | 137 | 139 | 149 |
| 0.2 | 115 | 128 | 145 |
| 0.3 | | | 136 |
| 0.4 | | | 119 |

METHOD OF MAKING A SEMICONDUCTOR DEVICE

BACKGROUND OF THE DISCLOSURE

1. Field of the Disclosure

The disclosure relates to a method of making a semiconductor device. More particularly, the disclosure relates to a method of making a semiconductor device, which can simplify control of an etch bias and improve the process margin of patterns by preparing dummy patterns at a lower-density portion among parts of relatively different densities of patterns to be formed in a photolithography process, the dummy patterns having the same size as the pattern desired to be formed, not over active areas, but over adjacent inactive areas.

2. Description of the Related Technology

Generally, a process of manufacturing a semiconductor device includes the step of manufacturing a pattern of a desired shape by depositing a specific thin film and selectively etching parts of the thin film through a photolithography process. In this step, the aforementioned pattern may have a high-density pattern area in which a great number of repetitive patterns are located in a narrow region, a low-density pattern area in which a small number of patterns are located in a wide region, and an intermediate-density pattern area between the high-density and low-density areas.

FIG. 1 is a plan view for explaining pattern areas having different densities of a semiconductor device in general. Herein, reference numeral 1 denotes a gate pattern, which is a main pattern, and reference numerals 2 and 3 denote an active area and a bit-line contact, respectively. Further, the letter A denotes a high-density pattern area, the letter B denotes an intermediate-density pattern area, and the letter C denotes a low-density pattern area.

The low-density pattern area C is lowered in its process margin in the photolithography process compared to the high-density pattern area A. To compensate for this, a process using a smaller wavelength and various RETs (Resolution Enhancement Technologies) is used, but the low-density pattern area C causes a sharp reduction in the margin of depth of focus process. Additionally, because, in an etching process for the pattern of the low-density area C, there is a relatively large bias compared to pattern A of the high-density area exists, a light exposure process has to be implemented at a smaller process margin. Furthermore, because the profile of the photoresist is deteriorated after light exposure, the uniformity of the critical regions is lowered to a large extent.

Conventionally, a exposure mask with an assist feature has been employed to improve the uniformity margin of critical regions for the low-density pattern area C. However, the assist feature does not actually form a pattern on a wafer, and affords only a small improvement in the depth of focus margin. Thus, it does not help to control etch bias or enhance the uniformity of critical regions.

FIG. 2 illustrates a conventional example of the formation of a low-density pattern area utilizing an assist feature. As illustrated therein, there is prepared an assist feature 4 for transmitting light onto the side parts of a gate pattern 1. Such an assist feature 4 is very small in width as compared to the gate pattern 1, the main pattern, and is shown only on an exposure mask, but does not actually form a pattern on a wafer.

FIG. 3 graphically illustrates the depth of focus process margin of each of the patterns by density so that the process margin utilizing the assist feature 4 may be compared with the process not utilizing the assist feature in terms of depth of the focus process margin. It can be seen that the depth of the focus process margin of the low-density pattern area in the process utilizing the assist feature 4 is enhanced compared to the process not utilizing the assist feature 4, but needs still more improvement as compared to the high-density pattern area and the intermediate-density pattern area.

SUMMARY OF THE DISCLOSURE

Disclosed herein is a method of making a semiconductor device, wherein the method can improve the margin of depth of focus process even in a low-density pattern area. The method also can improve the uniformity of critical regions by lowering the etch bias of a low-density pattern area.

In accordance with an aspect of the present invention, there is provided a manufacturing method for a semiconductor device, in which a main pattern is formed through a photolithography process over a low-density pattern area having a relatively small number of patterns to be formed in certain areas as compared to the other areas, wherein at least one or more dummy patterns are formed over inactive areas, and adjacent active areas, where the main pattern is formed, the dummy patterns being spaced a predetermined distance from the sides of the main pattern. Preferably, the dummy patterns are determined in spacing from the main pattern, spacing between the dummy patterns, and size according to a design rule. Furthermore, the dummy patterns preferably are formed in a direction that is the same as or perpendicular to the main pattern.

The method of making a semiconductor device generally includes providing a substrate having a low-density pattern area. The low-density pattern area includes an active area adjacent to inactive areas. The method also includes forming one or more dummy patterns over the inactive areas of the low-density pattern area and then forming a main pattern through a photolithography process over the active area of the low-density pattern area. The main pattern includes side portions that are spaced a predetermined distance from the inactive areas. Preferably, the dummy patterns are formed in a direction that is the same as or perpendicular to the main pattern. Preferably, the size of the dummy patterns, the spacing between the dummy patterns, and the spacing between the dummy patterns and side edges of the main pattern are determined according to a design rule.

BRIEF DESCRIPTION OF THE DRAWINGS

The above and other features and advantages of the disclosure will become more apparent by describing in detail exemplary embodiments thereof with reference to the attached drawings in which.

DESCRIPTION OF THE PREFERRED EMBODIMENTS

Figure 1:
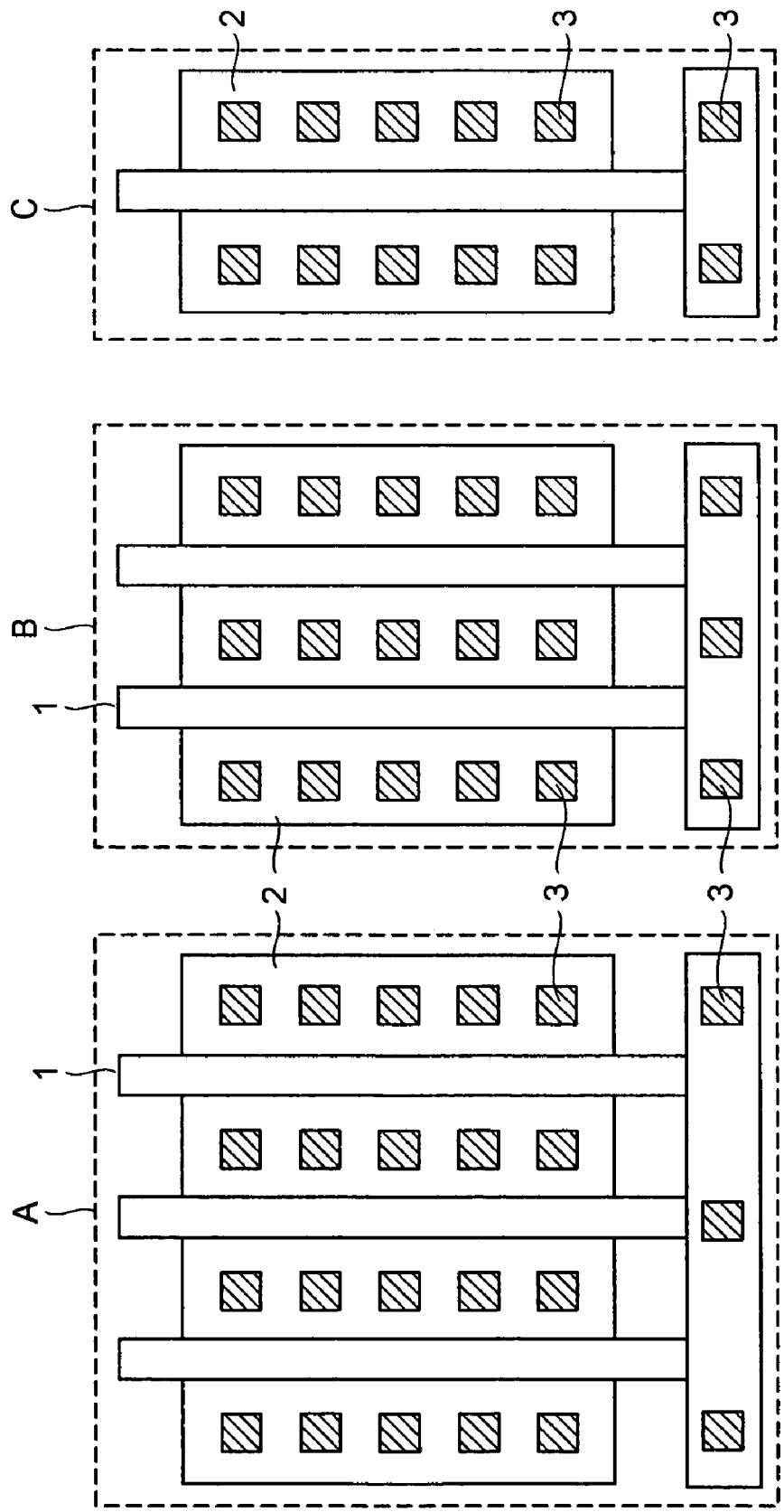
FIG. 1 is a plan view for explaining pattern areas having different densities of a semiconductor device in general.
Figure 2:
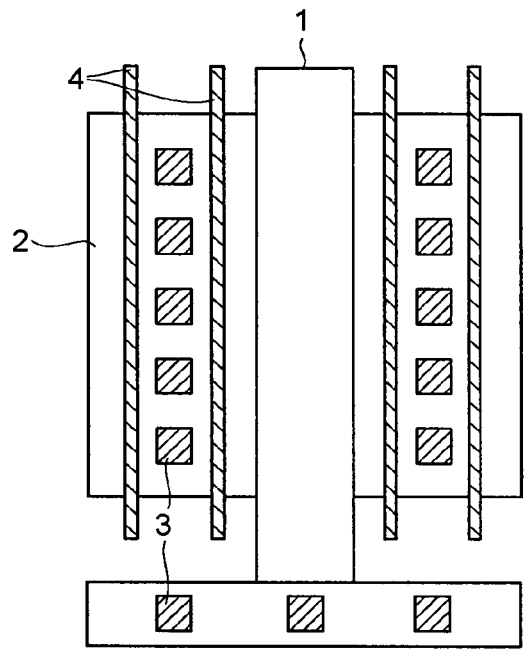
FIG. 2 is a plan view of a low-density pattern area utilizing an assist feature according to the conventional art.
Figure 3:
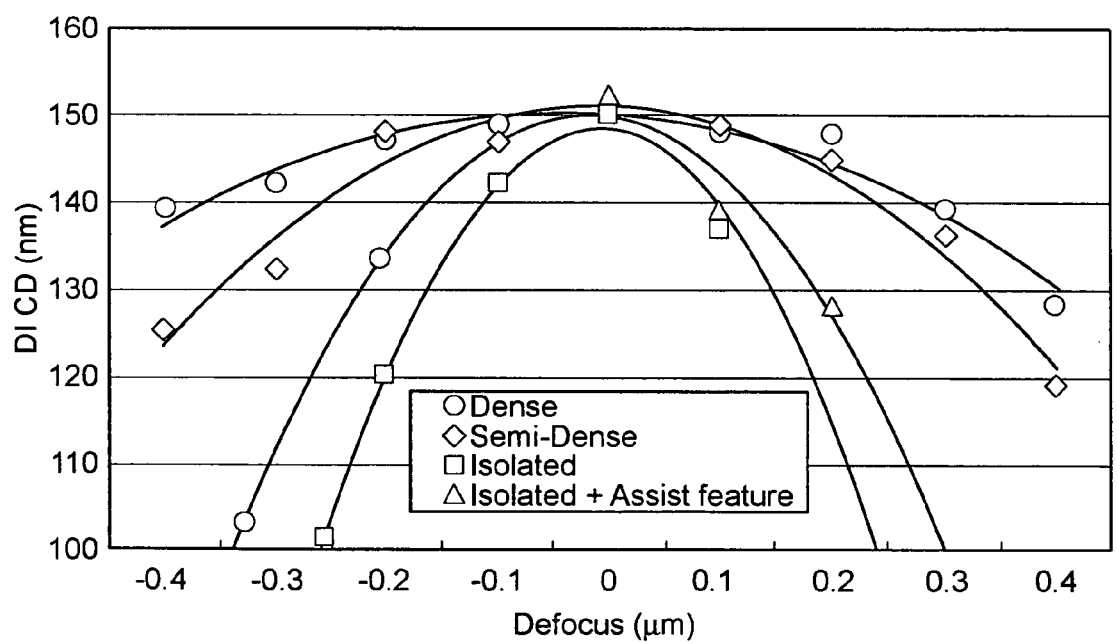
FIG. 3 is a graph showing differences in the margin of depth of focus process margin between a process utilizing an assist feature and a process not utilizing the assist feature.

A preferred embodiment according to the present invention will now be described in detail with reference to the accompanying drawings so that those skilled in the art may readily practice the invention.

In the drawings, the thickness is shown to be greater in order to clearly represent multiple layers and areas. Throughout the specification, like parts are denoted by like reference numerals.

Figure 4:
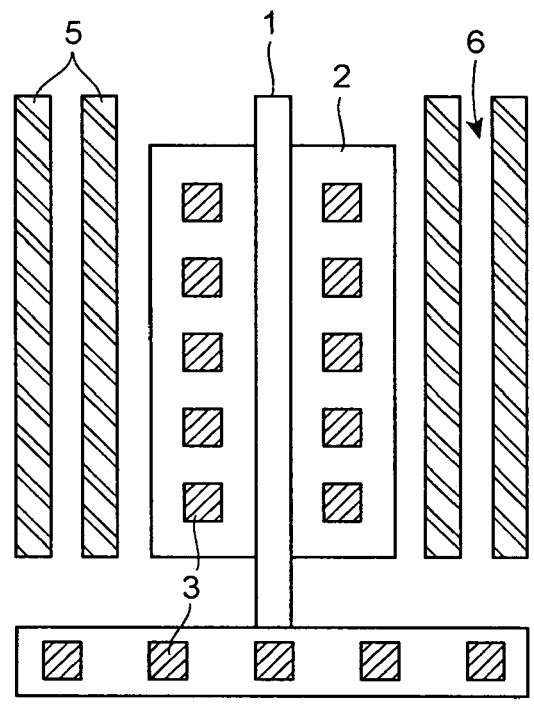
FIG. 4 is a plan view showing a manufacturing method for a semiconductor device according to an embodiment of the present invention when dummy patterns are adapted.

FIG. 4 is a plan view showing a manufacturing method for a semiconductor device according to an embodiment of the present invention when dummy patterns are adapted. As shown therein, in the process of forming a gate (main) pattern 1 in a low-density pattern area, a plurality of dummy patterns 5 are formed at a position spaced a predetermined distance from the sides of gate pattern 1, that is, over inactive areas 6 adjacent to active areas 2 where the gate pattern 1 is formed.

The dummy patterns 5 are formed at a constant size and constant number so as to be spaced a predetermined distance from the side parts of the gate pattern 1 considering the design rule for the active areas 2, bit-line contacts 3 around them. For instance, if the size of the gate (main) pattern 1 is 150 nanometers (nm) and the design rule between the active areas 2 and the gate pattern 1 is 100 nm, dummy patterns 5 having the same size as the gate pattern 1 are formed over the inactive areas which are spaced 100 nm from the tip end of the active areas 2. Besides, the distance between the dummy patterns 5 has to be properly spaced according to the design rule.

With the formation of the dummy patterns 5, the low-density pattern area can have the same density as the intermediate-density pattern area or high-density pattern area.

The dummy patterns 5 are actually formed over a wafer unlike the above-described method of using an assist feature according to the conventional art. This practically increases the density of the low-density pattern area to, thus, be able to obtain the same depth of focus process margin as the high-density or intermediate-density pattern area.

The etch bias largely depends on the density of the adjacent patterns. The higher the density becomes, the lower the etch bias becomes, and the smaller the etch bias becomes, the higher the uniformity of the critical regions becomes. The etch bias can be reduced by increasing the density by preparing the dummy patterns 5 on the side parts of the gate (main) pattern 1.

Figure 5:
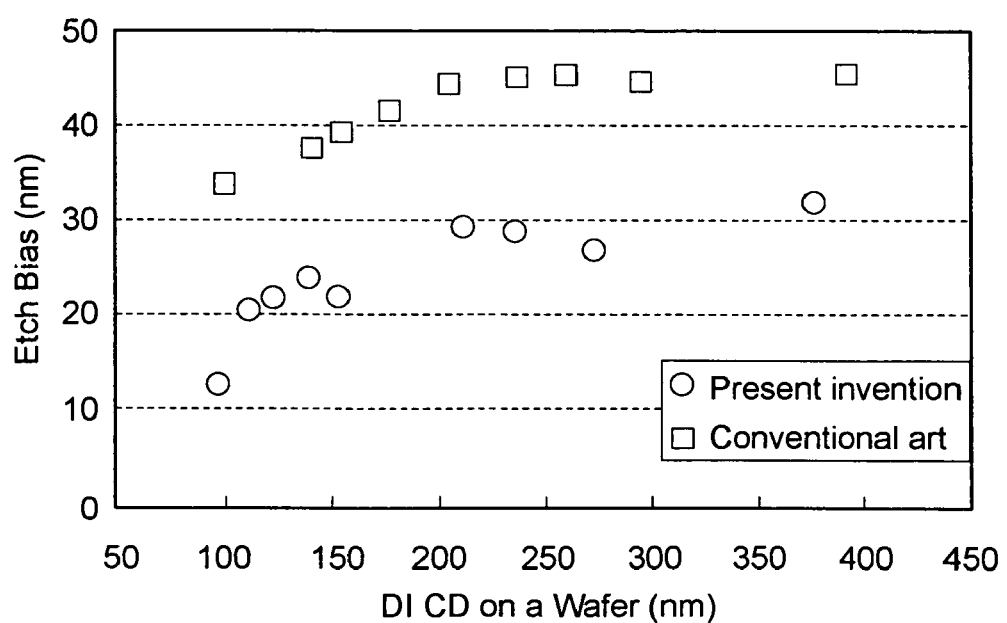
FIG. 5 is a graph comparing etch biases according to the present invention and the conventional art; and, FIG. 6 includes a graph and table comparing process margins according to the present invention and the conventional art.

FIG. 5 is a graph comparing etch biases according to the present invention and the conventional art. As shown therein, it can be seen that the etch bias according to the present invention is sharply reduced as compared to that in the conventional art.

When the etch bias is reduced, it is possible to improve the process margin of an exposure process because, if a target critical region is 150 nm and the etch bias is 50 nm, then the critical region to be realized in the exposure process becomes 100 nm, and if the etch bias is 20 nm, then the critical region to be realized in the exposure process becomes 130 nm.

Figure 6:
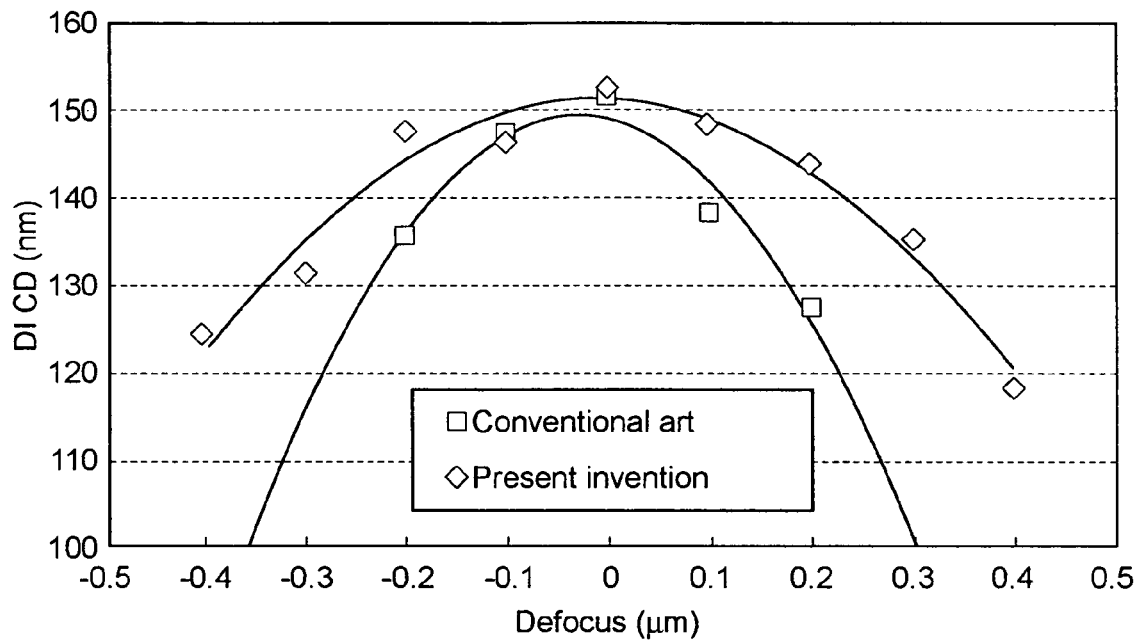

These differences in the process margin of the exposure process are shown in the graph and table of FIG. 6. In this table, the portion indicated as "isolated" denotes a process margin in a low-density area to which an assist feature is not adapted, while, in the conventional art, it denotes a process margin in a low-density area to which an assist feature is adapted. By this, it can be seen that the present invention greatly improves the depth of focus process margin. This improvement in depth of focus process margin is directly related to the yield of a semiconductor device, and the present invention can improve the yield of a semiconductor by improvement in the process margin.

The formation direction of the dummy patterns 5 are the same as the gate pattern 1, or the equivalent effect can be obtained even in the case of forming a multiplicity of patterns having a direction perpendicular to the gate pattern 1.

While the present invention has been described with reference to exemplary embodiments thereof, it will be understood by those skilled in the art that various changes in form and details may be made therein without departing from the scope of the present invention as defined by the following claims.

As described above, this invention can improve the process margin and improve the uniformity of the critical regions of patterns to thus improve the yield of a semiconductor device by making a low-density pattern area actually have the same pattern density as a high-density pattern area or intermediate-density pattern area by forming dummy patterns, which do not affect the semiconductor device, on the sides of a main pattern of the low-density pattern area according to a design rule.

What is claimed is:

1. A manufacturing method for a semiconductor device, comprising:
   forming a main pattern through a photolithography process over a low-density pattern area of a semiconductor substrate, the semiconductor substrate comprising the low-density pattern area and a high-density pattern area, the high density pattern area comprising a high-density pattern area active area, and the low-density pattern area comprising a low-density pattern area active area, wherein a number of patterns to be formed in the low-density pattern area active area is less than a number of patterns to be formed in the high-density pattern area active area, and
   forming one or more dummy patterns having substantially the same size as the main pattern on the semiconductor substrate over inactive areas adjacent to the low-density pattern area active area in which the main pattern is formed to increase a pattern density of the low-density pattern area such that the pattern density of the low-density pattern area is substantially the same as a pattern density of the high-density pattern area, the dummy patterns being spaced a predetermined distance from sides of the main pattern.

2. The method of claim 1, wherein the dummy patterns spacing from the main pattern, spacing between the dummy patterns, and a size of the dummy patterns are determined according to a design rule.

3. The method of claim 1, comprising forming the dummy patterns in a direction the same as or perpendicular to the main pattern.

4. A method of making a semiconductor device, the method comprising:
   (a) providing a semiconductor substrate having a high-density pattern area and a low-density pattern area, the low-density pattern area comprising low-density pattern area inactive areas and a low-density pattern area active area adjacent to the low-density pattern area inactive areas, and the high-density pattern area comprising high-density pattern area active area;
   (b) forming one or more dummy patterns on the semiconductor substrate over the low-density pattern area inactive areas to increase a pattern density of the low-density pattern area such that the pattern density of the low-density pattern area is substantially the same as a pattern density of the high-density pattern area; and, (c) forming a main pattern through a photolithography process over the low-density pattern area active area, the main pattern comprising side portions spaced a predetermined distance from the low-density pattern area inactive areas, wherein the dummy patterns are substantially the same size as the main pattern.

5. The method of claim 4, wherein a size of the one or more dummy patterns, spacing between the one or more dummy patterns, and spacing between the one or more dummy patterns and the side portions of the main pattern are determined according to a design rule.

6. The method of claim 4, comprising forming the one or more dummy patterns in a direction that is the same as or perpendicular to the main pattern.

* * * * *